US012699316B2

(12) United States Patent
Lam et al.

(10) Patent No.: US 12,699,316 B2
(45) Date of Patent: Aug. 4, 2026

(54) COMBINED DISPENSING AND STAMPING APPARATUS AND METHOD FOR APPLYING ADHESIVE FLUID DURING A BONDING PROCESS

(71) Applicant: ASMPT Singapore Pte. Ltd., Singapore (SG)

(72) Inventors: Kai Siu Lam, Hong Kong (CN); Nim Tak Wong, Hong Kong (CN); Xiaodong Chen, Hong Kong (CN); Kui Kam Lam, Hong Kong (CN)

(73) Assignee: ASMPT SINGAPORE PTE. LTD., Singapore (SG)

( * ) Notice: Subject to any disclaimer, the term of this patent is extended or adjusted under 35 U.S.C. 154(b) by 640 days.

(21) Appl. No.: 18/107,093

(22) Filed: Feb. 8, 2023

(65) Prior Publication Data

US 2024/0264524 A1     Aug. 8, 2024

(51) Int. Cl.
*G03F 7/00* (2006.01)

(52) U.S. Cl.
CPC ........ *G03F 7/0002* (2013.01); *G03F 7/70616* (2013.01); *G03F 7/70716* (2013.01);
(Continued)

(58) Field of Classification Search
None
See application file for complete search history.

(56) References Cited

U.S. PATENT DOCUMENTS

2010/0242268 A1     9/2010 Hiraki ............................ 29/739
2014/0131313 A1*   5/2014 Wakamatsu .......... G03F 7/0002
                                                                  703/2

(Continued)

FOREIGN PATENT DOCUMENTS

JP          60-262432  A    12/1985
JP          08-083976  A     3/1996
                    (Continued)

OTHER PUBLICATIONS

Machine English translation of JP2010177310, Accessed Jun. 20, 2025 (Year: 2010).*

(Continued)

*Primary Examiner* — Abbas Rashid
*Assistant Examiner* — Adrianna N Konves
(74) *Attorney, Agent, or Firm* — OSTROLENK FABER LLP

(57) ABSTRACT

An apparatus for applying an adhesive fluid onto a bonding surface during a bonding process includes a positioning table, a dispensing device, a stamping device and a switching member which are mounted on the positioning table. The dispensing device is configured to be positionable by the positioning table to dispense the adhesive fluid onto the bonding surface. The stamping device is configured to be positionable by the positioning table to stamp the adhesive fluid onto the bonding surface. The dispensing device and stamping device are operative to apply the adhesive fluid onto different bonding positions on the bonding surface. The switching member coupled to the stamping device is configured to move the stamping device to a first standby position when the dispensing device is dispensing the adhesive fluid and to a second standby position when the stamping device is stamping the adhesive fluid.

19 Claims, 6 Drawing Sheets

(52) U.S. Cl.
CPC ...... *G03F 7/70775* (2013.01); *G03F 7/70825* (2013.01); *G03F 7/70975* (2013.01)

(56) References Cited

U.S. PATENT DOCUMENTS

| | | | | |
|---|---|---|---|---|
| 2021/0313908 A1* | 10/2021 | Van Der Toorn | ...... | H02N 13/00 |
| 2022/0317568 A1* | 10/2022 | Kondo | .................. | G03F 7/0015 |

FOREIGN PATENT DOCUMENTS

| | | | |
|---|---|---|---|
| JP | 2010-177310 A | 8/2010 | |
| JP | 2010-225968 A | 10/2010 | |

OTHER PUBLICATIONS

Office Action dated Jan. 21, 2025 issued in corresponding Japanese Patent Application No. 2024-017102 and its English translation.

\* cited by examiner

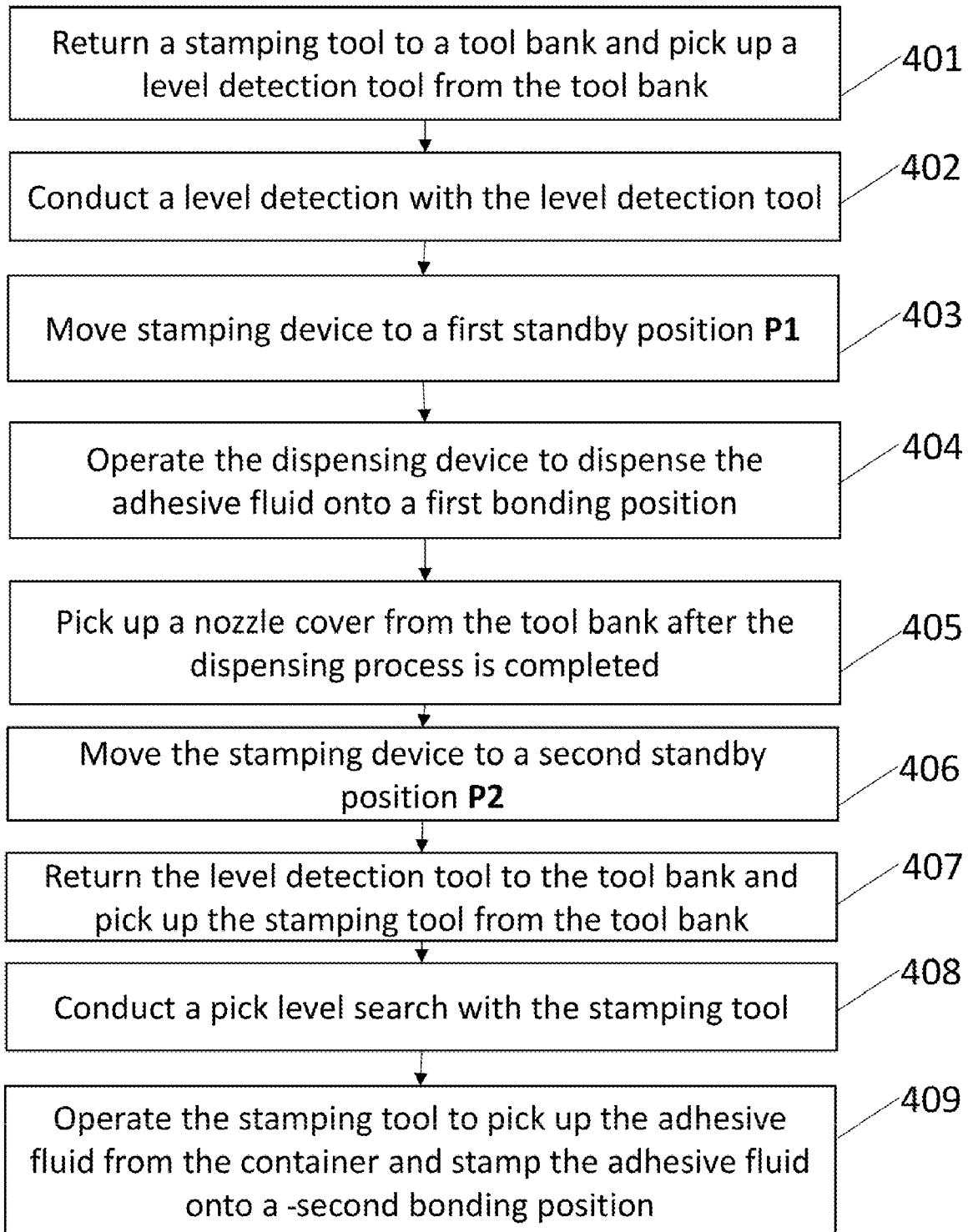

Return a stamping tool to a tool bank and pick up a level detection tool from the tool bank ⟋401

Conduct a level detection with the level detection tool ⟋402

Move stamping device to a first standby position P1 ⟋403

Operate the dispensing device to dispense the adhesive fluid onto a first bonding position ⟋404

Pick up a nozzle cover from the tool bank after the dispensing process is completed ⟋405

Move the stamping device to a second standby position P2 ⟋406

Return the level detection tool to the tool bank and pick up the stamping tool from the tool bank ⟋407

Conduct a pick level search with the stamping tool ⟋408

Operate the stamping tool to pick up the adhesive fluid from the container and stamp the adhesive fluid onto a -second bonding position ⟋409

FIG. 4

COMBINED DISPENSING AND STAMPING APPARATUS AND METHOD FOR APPLYING ADHESIVE FLUID DURING A BONDING PROCESS

FIELD OF THE INVENTION

The invention generally relates to the application of an adhesive fluid during a bonding process, and more specifically to an apparatus and method for applying the adhesive fluid, e.g., epoxy, onto a bonding surface during the bonding of multiple semiconductor chips.

BACKGROUND

A conventional approach for applying an adhesive fluid during a bonding process is to use a dispensing device to dispense the adhesive fluid onto a bonding surface. This dispensing approach is suitable for semiconductor chips or dies with large sizes, e.g., dies having a width of greater than 1 millimeter (mm), because a nozzle tip of the dispensing device which is too small may be prone to being stuck or clogged by the residue of the adhesive fluid. Another conventional approach for applying the adhesive fluid during a bonding process is to stamp the adhesive fluid onto a bonding surface with a stamping device. The stamping approach is suitable for dies with smaller sizes, e.g., dies having a width of less than 1 mm, as the adhesive fluid may fill up a gap or slot formed on a stamping tool when the stamping device is used to apply adhesive fluid onto a bonding surface of a die having a larger size, this may cause the volume or amount of adhesive fluid applied onto the bonding surface (such as a lead frame or substrate) to be inconsistent or unreliable.

During a multi-chip bonding process, either the dispensing or the stamping approach may be used for applying the adhesive fluid onto a bonding surface depending on the die size, so that dies with different sizes can be reliably bonded. FIG. 1 is a schematic front view of a conventional apparatus 100 for applying adhesive fluid during a multi-chip bonding process. As shown in FIG. 1, the conventional apparatus 100 includes a dispensing device 110 and a stamping device 120 which are installed on different positioning tables 110a, 120a respectively. The dispensing device 110 and the stamping device 120 also include individual optical systems 111, 121 that are mounted on the respective positioning tables 110a, 120a for facilitating the application of the adhesive fluid by each device 110, 120. Since two separate positioning tables and optical systems are included in the apparatus 100, a multi-chip bonding system incorporating this conventional apparatus 100 for applying the adhesive fluid is not space and cost-efficient. Furthermore, additional transfer time is required when switching between the two approaches for applying the adhesive fluid, i.e., switching from dispensing to stamping or vice versa during a multi-chip bonding process on a bonding surface.

It would therefore be beneficial to provide a new approach and solution for applying adhesive fluid during a multi-chip bonding process that can overcome at least one of the aforementioned shortcomings in the conventional apparatus and method.

SUMMARY OF THE INVENTION

It is thus an object of the invention to seek to provide a more cost and space efficient apparatus and method for applying an adhesive fluid during a multi-chip bonding process.

According to a first aspect of the present invention, there is provided an apparatus for applying an adhesive fluid onto a bonding surface during a die bonding process. The apparatus comprises a positioning table, a dispensing device mounted on the positioning table and configured to be positionable by the positioning table to dispense the adhesive fluid onto the bonding surface, a stamping device mounted on the positioning table and configured to be positionable by the positioning table to stamp the adhesive fluid onto the bonding surface, wherein the dispensing device and stamping device are operative to apply the adhesive fluid onto different bonding positions on the bonding surface, and a switching member that is mounted on the positioning table and coupled to the stamping device, which is configured to move the stamping device to a first standby position when the dispensing device is operated by the positioning table to dispense the adhesive fluid and to a second standby position when the stamping device is operated by the positioning table to stamp the adhesive fluid. It should be noted that the "mounted on" in embodiments of the invention may refer to directly or indirectly "mounted on".

In some embodiments, the apparatus may further include a container for storing the adhesive fluid, and the stamping device is configured to be positionable by the positioning table to contact and receive the adhesive fluid from the container. To further integrate the devices for applying the adhesive fluid onto the bonding surface, the apparatus may further include a first mounting frame on which the container is mounted.

The first mounting frame is coupled to the positioning table so that the container is movable with the positioning table. In order to ensure even distribution of the adhesive fluid in the container, the apparatus may further include a thickness adjusting member mounted on the first mounting frame for adjusting a thickness of the adhesive fluid in the container.

In some embodiments, the apparatus further includes a second mounting frame on which the dispensing device is mounted, the second mounting frame being coupled to the positioning table. In other words, the dispensing device is mounted on the positioning table via the second mounting frame so that the dispensing device is movable with the positioning table. In one embodiment, the second mounting frame may include a first mounting member coupled to the positioning table and a gripper located on the first mounting member, wherein the dispensing device is mounted on or held by the gripper so as to be movable with the positioning table.

In one embodiment, the switching member is attached to the first mounting member such that both the switching member and the stamping device to which the switching member is coupled are movable with the positioning table. Alternatively, the switching member may be attached to a second mounting member such that both the switching member and the stamping device to which the switching member is coupled are movable with the positioning table.

In some embodiments, the stamping device includes a stamping tool and a tool holder for releasably gripping the stamping tool. The stamping tool is positionable to pick up the adhesive fluid from the container and stamp the adhesive fluid onto the bonding surface.

In order to facilitate replacement of stamping tools installed on the stamping device, the apparatus may further include a tool bank. The tool bank is configured to include a first holder for releasably holding at least one stamping tool, wherein the stamping device is operative to pick up a stamping tool from the tool bank with the tool holder before stamping the adhesive fluid onto the bonding surface with the stamping tool.

In some embodiments, the stamping device may be used to conduct a level detection with a level detection tool. In order to facilitate automatic pickup and return of the level detection tool, the tool bank further includes a second holder for releasably holding a level detection tool, and the stamping device is further operative to pick up the level detection tool from the tool bank with the tool holder and to conduct a level detection with the level detection tool before the dispensing device is used for dispensing the adhesive fluid.

In some embodiments, the apparatus may further include a first image capturing device configured to detect a position of the stamping tool held by the stamping device, whereby the position of the stamping tool is adjustable.

In some embodiments, the stamping device further includes a force detector configured to detect a force applied by the stamping tool or the level detection tool held by the stamping device onto the bonding surface during contact therebetween. In one embodiment, the force detector may include a strain gauge sensor attached to the tool holder.

In order to prevent the adhesive fluid from leaking onto the bonding surface after the dispensing device is used to dispense the adhesive fluid, the tool holder further includes a third holder for holding a nozzle cover so that the dispensing device is further operative to pick up the nozzle cover from the tool holder for shielding a nozzle of the dispensing device.

In one embodiment, the switching member may include a pneumatic cylinder that is coupled to the stamping device and operative to reciprocally move the stamping device to the first standby position or the second standby position.

The apparatus may further include a second image capturing device attached to the dispensing device. The second image capturing device is configured to conduct a pattern recognition inspection on the electronic package before dispensing the adhesive fluid.

In some embodiments, the dispensing device may be operative to dispense the adhesive fluid onto a first bonding position for bonding at least one die having a dimension less than 1 millimeter, and the stamping device is operative to stamp the adhesive fluid onto a second bonding position for bonding at least one die having a dimension greater than 1 millimeter.

According to a second aspect of the present invention, there is provided a die bonding system comprising the apparatus for applying the adhesive fluid onto the bonding surface during a bonding process according to various embodiments of the invention.

According to a third aspect of the invention, there is provided a method for manufacturing a semiconductor device. The method comprises: positioning a dispensing device mounted on a positioning table to dispense an adhesive fluid with the dispensing device onto a first bonding position on a bonding surface during a die bonding process, positioning a stamping device mounted on the positioning table to stamp the adhesive fluid with the stamping device onto a second bonding position on the bonding surface, wherein a switching member that is mounted on the positioning table and coupled to the stamping device moves the stamping device to a first standby position when the dispensing device is operated by the positioning table to dispense the adhesive fluid and moves the stamping device to a second standby position when the stamping device is operated by the positioning table to stamp the adhesive fluid, and bonding a first semiconductor die at the first bonding position and a second semiconductor die at the second bonding position to form the semiconductor device.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which:

FIG. 4 is a flowchart illustrating a method for applying adhesive fluid onto a bonding surface using the apparatus according to one embodiment of the invention.

In the drawings, like parts are denoted by like reference numerals.

DETAILED DESCRIPTION OF THE PREFERRED EMBODIMENTS OF THE INVENTION

In the proposed apparatus for applying an adhesive fluid, e.g., epoxy, during a bonding process, the dispensing and stamping devices are designed to share a common positioning table and are fitted with common optical systems for conducting pattern recognition (PR) search such that the dispensing and stamping devices are arranged in a more compact manner. This helps to reduce the manufacturing cost, space utilization and transfer time when switching the manner of applying the adhesive fluid onto a bonding surface during the bonding process.

Figure 1:
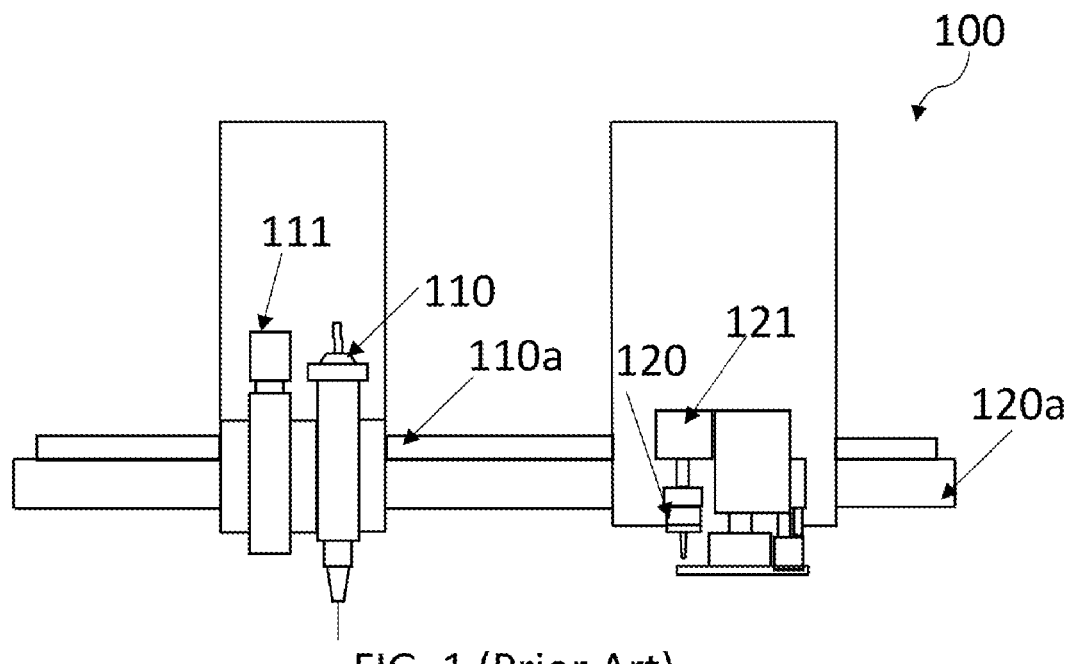
FIG. 1 is a schematic front view of a conventional apparatus for applying an adhesive fluid during a multi-chip bonding process.
Figure 2A:
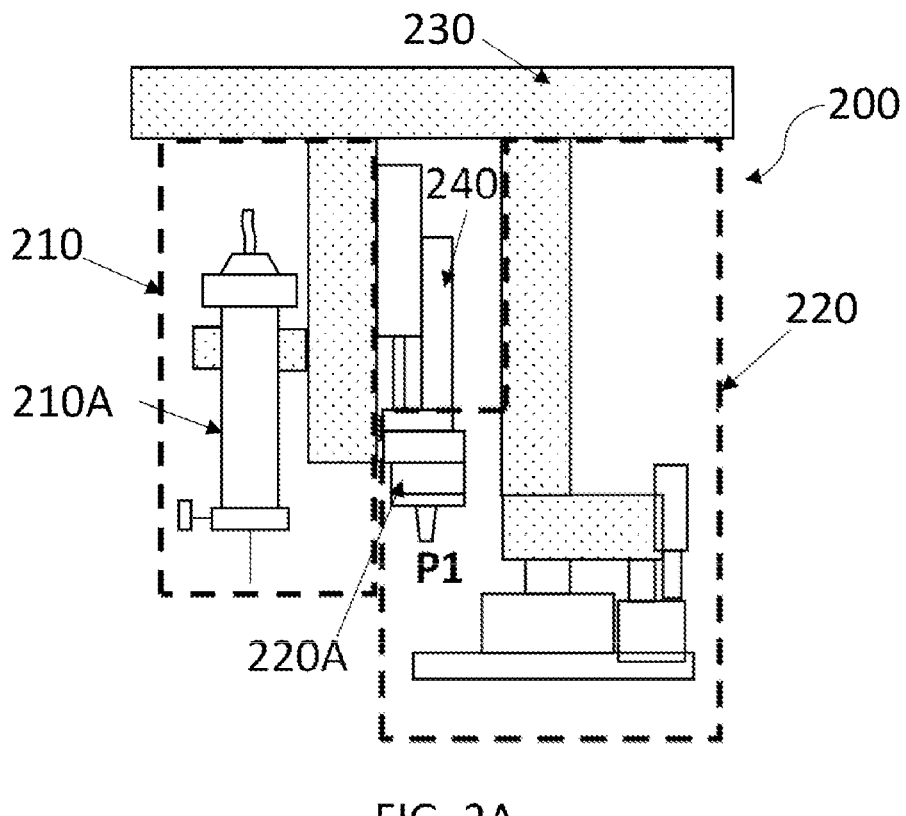
FIG. 2A and FIG. 2B show front views of an apparatus for applying an adhesive fluid onto a bonding surface when the apparatus is arranged in first and second configurations respectively during a multi-chip bonding process according to one embodiment of the invention.

FIG. 2A is a front view of an apparatus 200 for applying the adhesive fluid onto a bonding surface when the apparatus 200 is arranged in a first configuration during a multi-chip bonding process according to one embodiment of the invention. Referring to FIG. 2A, the apparatus 200 includes a dispensing mechanism 210 (depicted inside the dashed box on the left), a stamping mechanism 220 (depicted inside the dashed box on the right), a positioning table 230 on which both the dispensing mechanism 210 and the stamping mechanism 220 are mounted, and a switching member 240 that is mounted on the positioning table 230 so that the switching member 240 is also movable with the positioning table 230. The positioning table 230 may be an XYZ table.

The dispensing mechanism 210 includes a dispensing device 210A. The dispensing device 210A is mounted on the positioning table 230 and configured to be positionable by the positioning table 230 to dispense the adhesive fluid onto a first bonding position for bonding at least one die having a dimension less than 1 millimeter onto the bonding surface, e.g., a surface of a leadframe or a substrate. The stamping mechanism 220 includes a stamping device 220A. The stamping device 220A is configured to be positionable by the positioning table 230 to stamp the adhesive fluid onto a second bonding position for bonding at least one die having a dimension greater than 1 millimeter onto the bonding surface. The switching member 240 is coupled or connected to the stamping device 220A and is operative to locate the stamping device 220A at different standby positions relative to the dispensing device 210A so as to change the manner by which the adhesive fluid is applied.

Referring to FIG. 2A, when the apparatus 200 is arranged in the first configuration, a bottom end of the stamping device 220A is located by the switching member 240 at a first standby position P1 when the dispensing device 210A is operated by the positioning table 230 to apply the adhesive fluid. In the first configuration, the stamping device 220A is located further away from the bonding surface when the dispensing device 210A is positioned by the positioning table 230 to dispense the adhesive fluid onto the bonding surface.

Figure 2B:
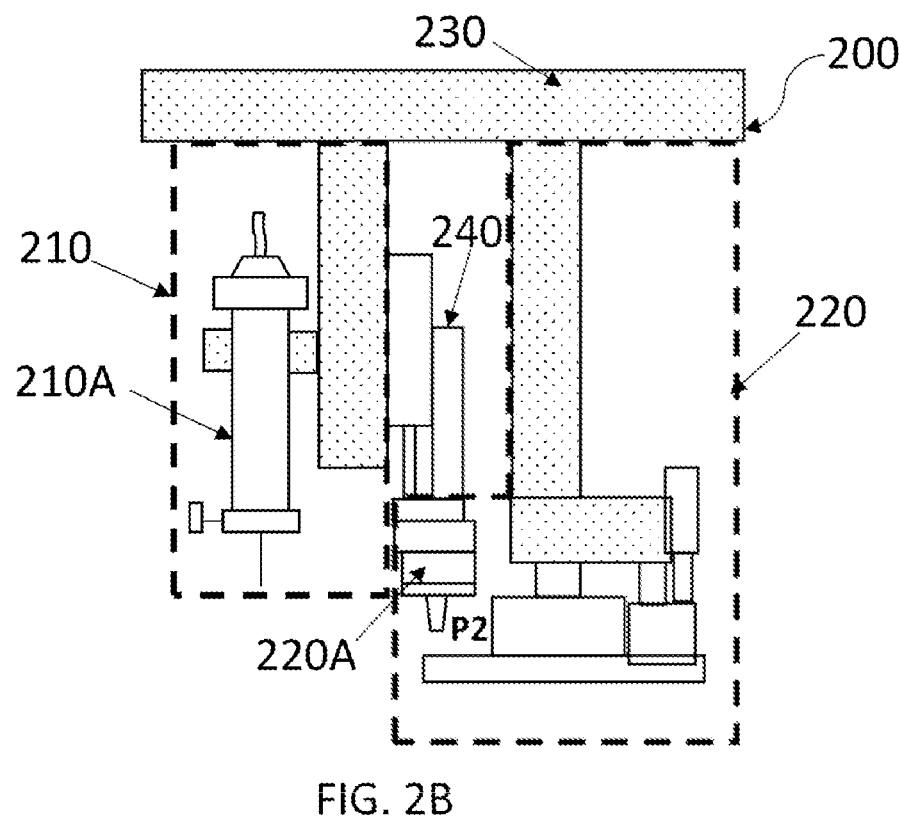

FIG. 2B is a front view of the apparatus 200 when the apparatus 200 is arranged in a second configuration during a multi-chip bonding process according to one embodiment of the invention. Referring to FIG. 2B, when the apparatus 200 is arranged in the second configuration, the bottom end of the stamping device 220A is located by the switching member 240 at a second standby position P2. when the stamping device 220A is operated by the positioning table 230 to apply the adhesive fluid. In the second configuration, the stamping device 220A is located closer to the bonding surface when it is positioned by the positioning table 230 to stamp the adhesive fluid onto the bonding surface.

In this embodiment, the first bonding position may be configured for bonding at least one die or chip having a width or dimension of between 1 mm and 6 mm, and the second bonding position may be configured for bonding at least one die or chip having a dimension of between 0.25 mm and 1 mm.

Figure 3A:
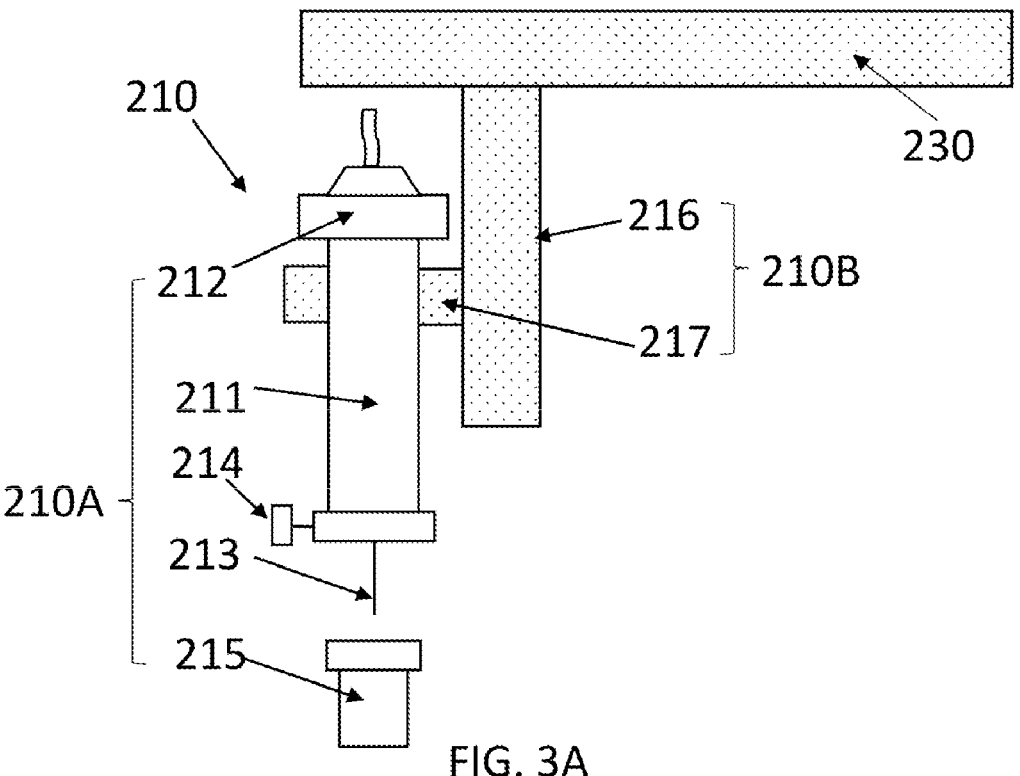
FIG. 3A is a front view of a dispensing mechanism including a dispensing device and a mounting frame according to the embodiment shown in FIGS. 2A and 2B.

FIG. 3A is a front view of the dispensing mechanism 210 according to the embodiment shown in FIGS. 2A and 2B. As shown in FIG. 3A, the dispensing mechanism 210 includes the dispensing device 210A and a mounting frame 210B coupled to the positioning table 230. The dispensing device 210A is mounted on the mounting frame 210B so that the dispensing device 210A is movable with the positioning table 230, i.e., the positioning table 230 is operative to control the movement of the dispensing device 210A. The dispensing device 210A in this embodiment is in the form of a syringe that includes a container 211, an adaptor 212, a nozzle 213 and a locking member 214. The container 211 is configured to hold the adhesive fluid to be dispensed during the dispensing process. The adaptor 212 is coupled to a first end of the container 211 in order to enclose the container 211 and to connect the container 211 to a dispensing controller (not shown) for providing pressure to push the adhesive fluid in the container 211 so that the adhesive fluid is dispensed through the nozzle 213. The locking member 214 is coupled to a second end of the container 211 and is configured to securely fix the nozzle 213 to the container 211. The dispensing device 210A may further include a nozzle cover 215 configured to shield the nozzle 213 so as to prevent the residual adhesive fluid in the container 211 from leaking onto the bonding surface when the dispensing mechanism 210 is not in use. The mounting frame 210B includes a mounting member 216 (i.e., the first mounting member) and a gripper 217 coupled, connected or attached to the mounting member 216. The mounting member 216 is coupled or connected to the positioning table 230 so that the dispensing device 210A is movable with the positioning table 230. The gripper 217 is located on the mounting member 216 by attachment or coupling, and is configured to securely hold the container 211. The mounting member 216 and the gripper 217 may be separate components that are releasably connected or coupled to each other or may be integrally formed with each other.

It should be noted that the structure and components of the dispensing device 210A and the mounting frame 210B in this embodiment are only for illustration purposes and are not intended to limit the scope of the invention. That is to say, in other embodiments, the dispensing device 210A and mounting frame 210B may have different structures and include different components.

Figure 3B:
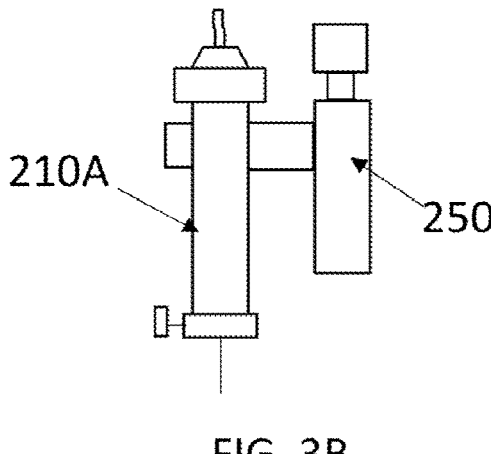
FIG. 3B is a side view of the dispensing device as shown in FIG. 3A.

FIG. 3B is a side view of the dispensing device 210A. As shown in FIG. 3B, the apparatus 200 further includes an image capturing device 250, e.g., a camera, that is coupled to the dispensing device 210A. In one embodiment, it is operative to conduct a pattern recognition (PR) search on the whole bonding surface before the dispensing device 210A and the stamping device 220A apply the adhesive fluid onto the bonding surface.

Figure 3C:
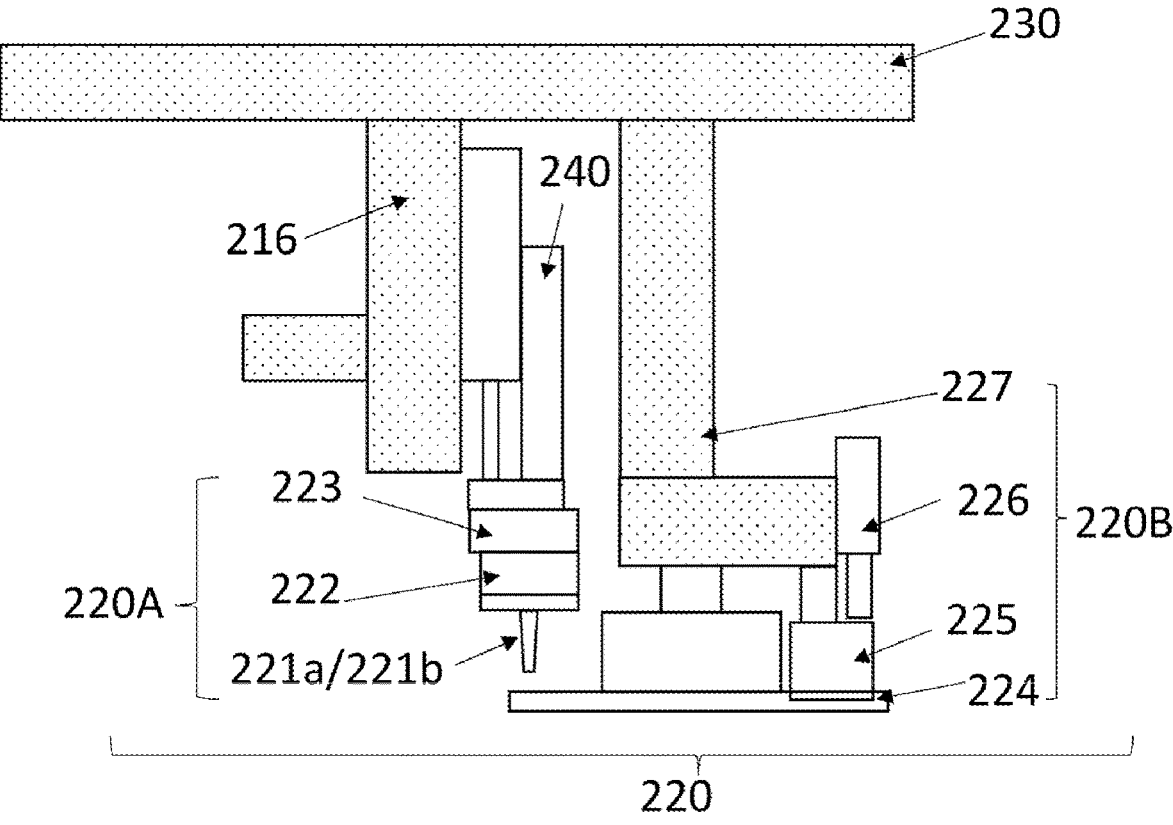
FIG. 3C is a front view of a stamping mechanism including a stamping device and a container according to the embodiment shown in FIGS. 2A and 2B.

FIG. 3C is a front view of the stamping mechanism 220 according to the embodiment shown in FIGS. 2A and 2B. The stamping mechanism 220 includes the stamping device 220A coupled to the switching member 240 and an adhesive-containing device 220B mounted on the positioning table 230. The switching member 240 is mounted on the positioning table 230 so that both the switching member 240 and the stamping device 220A are movable with the positioning table 230. In this embodiment, the switching member 240 is attached or coupled to the mounting member 216 of the mounting frame 210B. However, this is only for illustration purposes. In other embodiments, the switching member 240 may be installed onto or coupled to the positioning table 230 through a separate mounting member. Accordingly, the dispensing device 210A may be attached to the switching member 240 so that the dispensing device 210A, the stamping device 220A and the switching member 240 are all movable with the positioning table 230.

Referring to FIG. 3C, the stamping device 220A includes a stamping tool 221a or a level detection tool 221b, a tool holder 222 and a force detector 223. The tool holder 221 is configured to releasably grip the stamping tool 221a when the stamping tool 221a is used for handling the adhesive fluid or to releasably grip the level detection tool 221b when the level detection tool 221b is used for level detection during a dispensing process. The force detector 223 is configured to detect a force applied by the stamping tool 221a or the level detection tool 221b held by the stamping device 220A onto the bonding surface during contact therebetween. Specifically, the force detector 223 is operative to detect a stamping force or conduct a pick level search with the stamping tool 221a during a stamping process or to conduct a level detection with the level detection tool 221b during a dispensing process. The detected force values are received by a control system communicably connected to the apparatus 200, e.g., a computer, and used to determine a stamping force or a pick up level during the stamping process, or to determine a level or an encoder value that should be used during the dispensing process.

In this embodiment, the force detector 223 may be in the form of a strain gauge sensor that is attached to the tool holder 222. During the bonding process, the stamping device 220A may be operated to securely grip a stamping tool 221a with the tool holder 222 so as to use the stamping tool 221a to apply the adhesive fluid. The stamping device 220A may also be operated to remove or release the stamping tool 221a when the stamping tool 221a is not in use or when it is not required, e.g., when the stamping tool 221a needs to be changed or a level detection tool 221b is needed to conduct a level detection operation. The stamping device 220A may be also operated to securely grip a level detection tool 221b with the tool holder 222 when the level detection tool 221b is required to conduct a level detection on the electronic package when the dispensing device 210A is used for dispensing the adhesive fluid, and then to remove or release the level detection tool 221b when the level detection tool 221b is not in use or not required.

The adhesive-containing device 220B includes a container 224 for holding the adhesive fluid to be used during the stamping process. The container 224 is coupled to or mounted on the positioning table 230 so that the container 224 is movable with the dispensing table 230 during application of adhesive fluid onto the bonding surface. The stamping device 220A is further positionable by the positioning table 230 to pick up the adhesive fluid with the stamping tool 221a from the container 224 before stamping the adhesive fluid onto the bonding surface. It should be noted that the container 224 may be directly or indirectly coupled to or mounted on the positioning table 230.

Still referring to FIG. 3C, the adhesive-containing device 220B may further include a thickness adjusting member configured for adjusting the thickness of the adhesive fluid in the container 224 so that the adhesive fluid therein is flattened with a specified thickness. In this embodiment, the thickness adjusting member may include a sweeper 225 for sweeping the adhesive fluid in the container 224 so as to flatten the surface of the adhesive fluid in the container 224 and a micrometer 226 operable to measure a thickness of the adhesive fluid in the container 224. The adhesive-containing device 220B also includes a mounting frame 227 configured to mount the adhesive-containing device 220B to the positioning table 230 so that the adhesive-containing device 220B is movable with the positioning table 230. Specifically, as shown in FIG. 3C, the container 224, the sweeper 225 and the micrometer 226 are all attached to the mounting frame 227 that is coupled to the positioning table 230.

Figure 3D:
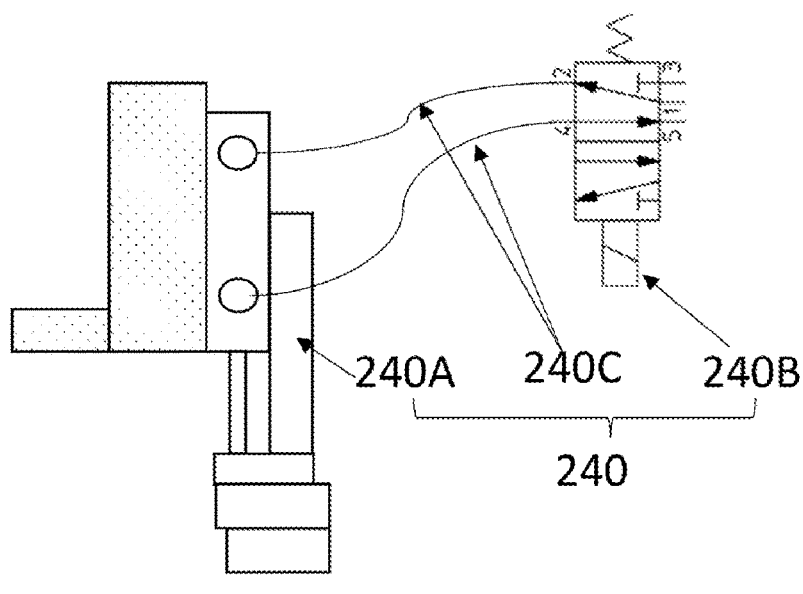
FIG. 3D is a front view of the switching member according to one embodiment of the invention.

FIG. 3D is a front view of the switching member 240 according to one embodiment of the invention. As shown in FIG. 3D, the switching member 240 in this embodiment includes a pneumatic cylinder 240A, a solenoid 240B and an air tube 240C arranged to connect the pneumatic cylinder 240A and the solenoid 240B. The solenoid 240B may be communicably connected to the control system so that the operation of the switching member 240 is controlled by the control system according to a preset bonding schedule. The pneumatic cylinder 240A is operative to move the stamping device 220A to the first standby position P1 during the dispensing process and to move the stamping device 220A to the second standby position P2 during the stamping process. The air tube 240C is configured to supply compressed air to the pneumatic cylinder 240A. The solenoid

240B is operative to switch a direction of the pneumatic path so as to adjust a movement direction of the pneumatic cylinder 240A. In other words, the control system is configured to control the pneumatic path direction by turning the pneumatic solenoid 240C on or off, thereby controlling the movement direction of the pneumatic cylinder 240A. That is, the pneumatic cylinder 240A is actuated to move upwards relative to the dispensing device 210A to move the stamping device 220A to the first standby position P1 when conducting the dispensing process, and is actuated to move downwards relative to the dispensing device 210A to move the stamping device 220A to the second standby position P2 when conducting the stamping process.

Figure 3E:
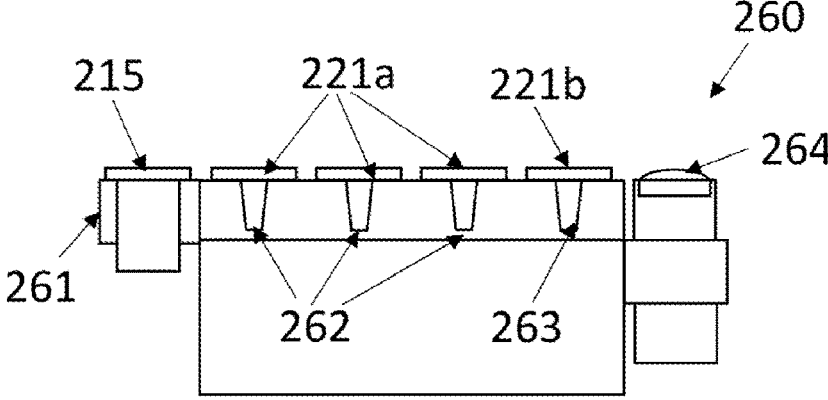
FIG. 3E is a front view of a tool bank of the apparatus according to one embodiment of the invention.
Figure 3F:
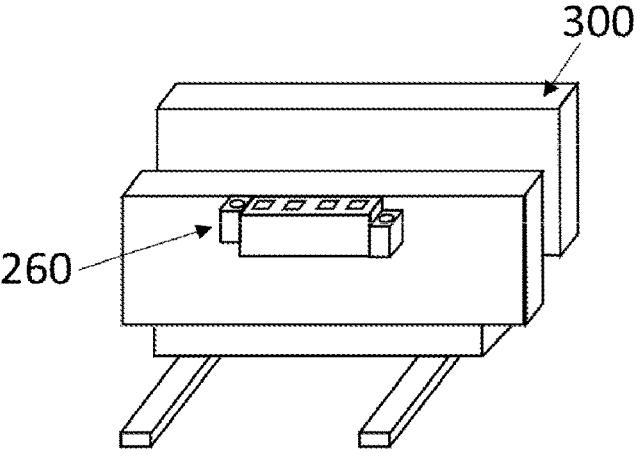
FIG. 3F is a perspective view of a worktable on which the tool bank is attached according to one embodiment of the invention.

According to some embodiments of the invention, the apparatus 200 may further include a tool bank. FIG. 3E is a front view of a tool bank 260 of the apparatus 200 according to one embodiment of the invention. The tool bank 260 includes a plurality of holders 261, 262, 263 configured to hold nozzle covers 215, at least one stamping tool 221a and at least one level detection tool 221b when they are not in use. As shown in FIG. 3E, in this embodiment, the holder 261 is configured to hold the nozzle cover 215, the holders 262 are configured to hold a number of stamping tools 221a and the holder 263 is configured to hold the level detection tool 221b. Notably, the holders 262 may be configured to hold a higher number of stamping tools in other embodiments. The tool bank 260 may further include an image capturing device 264, such as an up-look camera, which is configured to detect a position of the stamping tool 221a held by the stamping device 220A so as to align and adjust the position of the stamping tool 221a when required, e.g., when the stamping tool 221a has been changed. The tool bank 260 may be installed or mounted on a worktable of the apparatus 200 on which the bonding process is conducted. FIG. 3F is a perspective view of a worktable 300 on which the tool bank 260 is attached. The tool bank 260 may be located at any location on the worktable as long as the positioning table 230 can move the apparatus 200 above the tool bank 260 to place or pick up tools at the location.

Figure 3G:
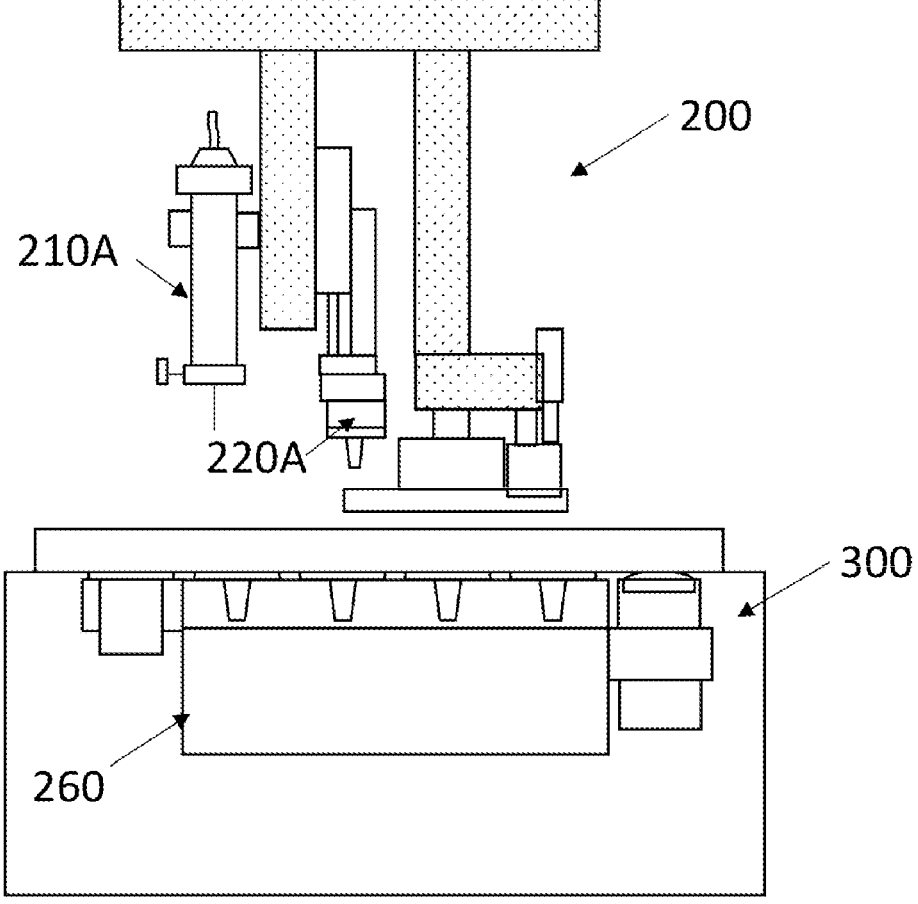
FIG. 3G is a front view of the apparatus including the tool bank shown in FIG. 3F according to one embodiment of the invention.

FIG. 3G is a front view of the apparatus 200 including the tool bank 260 that is attached to the worktable 300 according to one embodiment of the invention. Referring to FIG. 3G, during the bonding process, the stamping device 220A may be further positionable by the positioning table 230 to pick up the stamping tool 221a with the tool holder 222 from the tool bank 260 before using the stamping tool 221a for stamping the adhesive fluid onto the bonding surface, and to return the stamping tool 221a to the tool bank 260 when the stamping tool 221a is not in use or required, e.g., when the stamping tool 221a needs to be changed or a level detection tool 221b is needed to conduct a level detection. The stamping device 220A may be also positionable by the positioning table 230 to pick up a level detection tool 221b from the tool bank 260 using the tool holder 222 when the level detection tool 221b is required to conduct a level detection on the bonding surface when the dispensing device 210A is to be used for dispensing the adhesive fluid and to return the level detection tool 221b to the tool bank when the level detection tool 221b is not in use or required. In addition, the dispensing device 210A may be further positionable by the positioning table 230 to pick up the nozzle cover 215 from the tool bank 260 for shielding a nozzle of the dispensing device 210A to prevent the adhesive fluid from leaking onto the bonding surface after the dispensing device 210A has finished applying the adhesive fluid onto the bonding surface.

When the apparatus 200 is used for applying the adhesive fluid onto a bonding surface during a multi-chip bonding process, the apparatus 200 is communicably connected to a control system that is operative to control the apparatus 200 to apply the adhesive fluid according to a preset schedule, e.g., a schedule indicating the positions and timings for conducting the dispensing process with the dispensing device 210A and the stamping process with the stamping device 220A.

The proposed apparatus 200 may be included in a die bonding system for manufacturing a semiconductor device. Embodiments of the invention also provide a method for applying the adhesive fluid onto the bonding surface during a multi-chip bonding process and a method for manufacturing a semiconductor device including the method for applying the adhesive fluid. The method for applying the adhesive fluid onto the bonding surface includes the following steps:

positioning the dispensing device 210A mounted on the positioning table 230 to dispense an adhesive fluid with the dispensing device 210A onto a first bonding position on the bonding surface during a die bonding process, and positioning the stamping device 220A mounted on the positioning table 230 to stamp the adhesive fluid with the stamping device 220A onto a second bonding position on the bonding surface, wherein the switching member 240 that is mounted on the positioning table 230 and coupled to the stamping device 220A moves the stamping device 220A to a first standby position P1 when the dispensing device 210A is operated by the positioning table 230 to dispense the adhesive fluid and moves the stamping device 220A to a second standby position P2 when the stamping device 220A is operated by the positioning table 230 to stamp the adhesive fluid.

The method for manufacturing the semiconductor device may further include a bonding step to form the semiconductor device, e.g., a step of bonding a first semiconductor die at the first bonding position and a second semiconductor die at the second bonding position to form one or more semiconductor devices.

FIG. 4 is a flowchart illustrating a method for applying the adhesive fluid onto a bonding surface using the apparatus 200 according to one embodiment of the invention. In this embodiment, it is assumed that a stamping tool 221a of the apparatus 200 is initially securely held by the tool holder 222 and moved to the second standby position P2 for conducting the stamping process. Further, the control system communicably connected to the apparatus 200 has received a preset bonding schedule for conducting the dispensing process on a first bonding position on the bonding surface first, before conducting the stamping process on a second bonding position on the bonding surface. The control system is configured to control the movement of the positioning table 230 and the movement of the switching member 240 to conduct the dispensing and stamping processes according to the preset bonding schedule.

At Step 401, the stamping device 220A is operated to return the stamping tool 221a to the tool bank 260 and to pick up the level detection tool 221b from the tool bank 260.

Specifically, the control system controls the positioning table 230 to position the stamping device 220A above the tool bank 260 so as to return the stamping tool 221a to the tool bank 260. After the stamping tool 221a has released and placed the stamping tool 221a in the tool bank 260, the stamping device 220A is further operated to pick up a level detection tool 221b from the tool bank 260.

At Step 402, the stamping device 220A with the level detection tool 221b is moved downwards to conduct a level detection for the dispensing process.

Specifically, the stamping device 220A with the level detection tool 221b is moved downwards by the positioning table 230 at a constant speed until a contact force that is detected by the force detector 223 exceeds a predetermined threshold value. An encoder value corresponding to the detected contact force value is recorded by the control system so that this encoder value or level is used for the dispensing process.

Before conducting the said level detection, a pad pattern recognition (PR) search may be conducted for all units on the bonding surface where the dispensing and stamping processes are to be conducted, i.e., both at the first bonding position and the second bonding position on the bonding surface.

At Step 403, the stamping device 220A is moved upwards by the switching member 240 until the stamping device 220A is located at the first standby position P1 and the dispensing device 220A is located closer to the bonding surface. The dispensing table is then positioned by the positioning table 230 to dispense the adhesive fluid onto the first bonding position on the bonding surface.

At Step 404, the dispensing device 220A is operated to dispense the adhesive fluid onto the first bonding position on the bonding surface.

If the nozzle 213 is initially shielded by the nozzle cover 215 before the dispensing process to dispense the adhesive fluid, the method further includes a step of removing the nozzle cover 215 from the dispensing device 210A. Specifically, the step of removing the nozzle cover 215 may include: positioning the dispensing device 210A above the tool bank 260 with the positioning table 230 and operating the dispensing device 210A to release the nozzle cover 215 and to place it in the tool bank 260.

At Step 405, after the dispensing process is completed, the dispensing device 220A is positioned by the positioning table 230 above the tool bank 260 and is operated to pick up the nozzle cover 215 from the tool bank 260. The nozzle cover 215 is used to shield the nozzle 213 and to prevent the adhesive fluid from leaking onto the bonding surface.

At Step 406, the stamping device 220A is moved downwards by the switching member 240 until the stamping device 220A is located at the second standby position P2 where the stamping device 220A is located closer to the bonding surface. The stamping device 220A is then positioned by the positioning table 230 to conduct the stamping process on the second bonding position on the bonding surface.

Specifically, the control system controls the solenoid 240C to switch the pneumatic path direction so as to adjust the movement direction of the pneumatic cylinder 240A, thereby moving the stamping device 220A to either the first or the second standby position.

At Step 407, the stamping device 220A is moved above the tool tank 260 by the positioning table 230 and is operated to return the level detection tool 221b to the tool bank 260 and to pick up the stamping tool 221a from the tool bank 260.

At Step 408, the stamping device 220A is moved by the positioning table 230 to conduct a pick level search with the stamping tool 221a.

Specifically, the stamping device 220 which is equipped with the force detector 223 is moved downwards at a constant speed until the force detector 223 detects a trigger force when the stamping tool 221a contacts a bottom surface of the container 224. This pick level search can help to ensure that a constant volume of the adhesive fluid is picked up since the movement speed of the stamping device 220 and the trigger force of the force detector 223 can be adjusted during the search.

At Step 409, the stamping tool 221*a* is operated to pick up the adhesive fluid from the container 224 and to stamp the adhesive fluid onto the second bonding position on the bonding surface.

During the stamping process, the force detector 223 detects the stamping force applied by the stamping tool 221*a* so that the control system can monitor the stamping force in order to determine whether the stamping force exceeds a predetermined threshold value or is otherwise within an appropriate range. The purpose is to ensure that the adhesive fluid is applied with an appropriate stamping force and to protect the stamping tool 221*a* from being damaged due to the application of an excessive stamping force.

If a subsequent dispensing process is required after the stamping process, the process then returns to step 401 where the stamping tool 221*a* is returned to the tool bank 260.

As will be appreciated from the above description, embodiments of the invention provide an integrated apparatus for applying the adhesive fluid onto a bonding surface during a multi-chip bonding process. In this apparatus, the dispensing device and the stamping device for applying the adhesive fluid onto different bonding positions on the bonding surface are integrated on a common positioning table by way of a switching member coupled to the stamping device. This switching member is operative to move the stamping device to different standby positions relative to the dispensing device so as to automatically switch the manner of applying the adhesive fluid. Since the dispensing and stamping devices in the proposed apparatus for applying the adhesive fluid share a common positioning table and optical systems, e.g., the image capturing device for conducting the PR search, the apparatus has a more compact size and a lower manufacturing cost. Furthermore, the time required for switching the manner of applying the adhesive fluid is significantly reduced as compared to the prior art since the dispensing device and the stamping device are arranged in a more compact way, thereby significantly improving the productivity of the bonding process.

Although the present invention has been described in considerable detail with reference to certain embodiments, other embodiments are possible. Therefore, the spirit and scope of the appended claims should not be limited to the description of the embodiments contained herein.

The invention claimed is:

1. An apparatus for applying an adhesive fluid onto a bonding surface during a die bonding process, the apparatus comprising:

a positioning table, a dispensing device mounted on the positioning table and configured to be positionable by the positioning table to dispense the adhesive fluid onto the bonding surface, a stamping device mounted on the positioning table and configured to be positionable by the positioning table to stamp the adhesive fluid onto the bonding surface, wherein the dispensing device and stamping device are operative to apply the adhesive fluid onto different bonding positions on the bonding surface, a switching member that is mounted on the positioning table and coupled to the stamping device, which is configured to move the stamping device to a first standby position when the dispensing device is operated by the positioning table to dispense the adhesive fluid and to move the stamping device to a second standby position when the stamping device is operated by the positioning table to stamp the adhesive fluid, and a container coupled to or mounted on the positioning table for storing the adhesive fluid used by the stamping device, wherein the stamping device is further configured to be positionable by the positioning table to contact and receive the adhesive fluid from the container.

2. The apparatus according to claim 1, further comprising a first mounting frame on which the container is mounted, the first mounting frame being coupled to the positioning table.

3. The apparatus according to claim 2, further comprising a thickness adjusting member mounted on the first mounting frame for adjusting a thickness of the adhesive fluid in the container.

4. The apparatus according to claim 2, further comprising a second mounting frame on which the dispensing device is mounted, the second mounting frame being coupled to the positioning table.

5. The apparatus according to claim 4, wherein the second mounting frame comprises a first mounting member coupled to the positioning table, and a gripper located on the first mounting member, wherein the dispensing device is mounted on the gripper.

6. The apparatus according to claim 5, wherein the switching member is attached to the first mounting member such that both the switching member and the stamping device to which the switching member is coupled are movable with the positioning table.

7. The apparatus according to claim 5, wherein the switching member is attached to a second mounting member such that both the switching member and the stamping device to which the switching member is coupled are movable with the positioning table.

8. The apparatus according to claim 1, wherein the stamping device comprises at least one stamping tool and a tool holder for releasably gripping the stamping tool.

9. The apparatus according to claim 8, further comprising a tool bank including a first holder for releasably holding the at least one stamping tool, wherein the stamping device is operative to pick up the at least one stamping tool from the tool bank with the tool holder before stamping the adhesive fluid onto the bonding surface with the stamping tool.

10. The apparatus according to claim 9, wherein the tool bank further comprises a second holder for releasably holding a level detection tool, and the stamping device is further operative to pick up the level detection tool from the tool bank with the tool holder and to conduct a level detection with the level detection tool before the dispensing device is used for dispensing the adhesive fluid.

11. The apparatus according to claim 9, wherein the tool bank further comprises a first image capturing device configured to detect a position of the stamping tool held by the stamping device, whereby the position of the stamping tool is adjustable.

12. The apparatus according to claim 9, wherein the stamping device further comprises a force detector configured to detect a force applied by the stamping tool or a level detection tool held by the stamping device onto the bonding surface during contact therebetween.

13. The apparatus according to claim 12, wherein the force detector includes a strain gauge sensor attached to the tool holder.

14. The apparatus according to claim 9, wherein the tool holder further comprises a third holder for holding a nozzle cover, and the dispensing device is further operative to pick up the nozzle cover from the tool holder for shielding a nozzle of the dispensing device to prevent the adhesive fluid from leaking onto the bonding surface.

15. The apparatus according to claim 1, wherein the switching member comprises a pneumatic cylinder that is coupled to the stamping device and operative to reciprocally move the stamping device to the first standby position or the second standby position.

16. The apparatus according to claim 1, further comprising an image capturing device attached to the dispensing device and configured to conduct a pattern recognition inspection on the bonding surface before dispensing the adhesive fluid.

17. The apparatus according to claim 1, wherein the dispensing device is operative to dispense the adhesive fluid onto a first bonding position for bonding at least one die having a dimension less than 1 millimeter, and the stamping device is operative to stamp the adhesive fluid onto a second bonding position for bonding at least one die having a dimension greater than 1 millimeter.

18. A die bonding system comprising an apparatus for applying the adhesive fluid onto the bonding surface according to claim 1.

19. A method for manufacturing a semiconductor device with the apparatus of claim 1, the method comprising:

positioning the dispensing device to dispense the adhesive fluid with the dispensing device onto a first bonding position on the bonding surface during the die bonding process, positioning the stamping device to stamp the adhesive fluid with the stamping device onto a second bonding position on the bonding surface, wherein the switching member moves the stamping device to the first standby position when the dispensing device is operated by the positioning table to dispense the adhesive fluid and moves the stamping device to the second standby position when the stamping device is operated by the positioning table to stamp the adhesive fluid, and bonding a first semiconductor die at the first bonding position and a second semiconductor die at the second bonding position to form the semiconductor device.

* * * * *